(12) United States Patent
Williams

(10) Patent No.: US 6,172,383 B1
(45) Date of Patent: Jan. 9, 2001

(54) POWER MOSFET HAVING VOLTAGE-CLAMPED GATE

(75) Inventor: Richard K. Williams, Cupertino, CA (US)

(73) Assignee: Siliconix incorporated, Santa Clara, CA (US)

(*) Notice: Under 35 U.S.C. 154(b), the term of this patent shall be extended for 0 days.

(21) Appl. No.: 09/306,003

(22) Filed: May 5, 1999

Related U.S. Application Data

(63) Continuation-in-part of application No. 09/001,768, filed on Dec. 31, 1997.

(51) Int. Cl.$^7$ .............................. H01L 29/78; H01L 29/41

(52) U.S. Cl. .......................... 257/173; 257/331; 257/355; 257/341; 257/328

(58) Field of Search ..................................... 257/173, 355, 257/328, 331, 341, 329, 252; 361/88

(56) References Cited

U.S. PATENT DOCUMENTS

| | | | |
|---|---|---|---|
| 3,967,295 | 6/1976 | Stewart | 357/51 |
| 4,751,408 | 6/1988 | Rambert | 307/571 |
| 4,757,363 | 7/1988 | Bohm et al. | 357/23.13 |
| 4,760,434 | 7/1988 | Tsuzuki et al. | 357/23.13 |
| 4,831,424 | 5/1989 | Yoshida et al. | 357/23.13 |
| 4,931,846 | 6/1990 | Mihara | 357/23.4 |
| 5,119,162 | 6/1992 | Todd et al. | 357/43 |
| 5,274,274 | 12/1993 | Leman et al. | 307/360 |
| 5,397,914 | 3/1995 | Suda et al. | 257/570 |
| 5,439,842 | 8/1995 | Chang et al. | 437/70 |
| 5,504,449 | 4/1996 | Prentice | 327/427 |
| 5,525,829 | 6/1996 | Mistry | 257/473 |
| 5,525,925 | 6/1996 | Bayer | 327/377 |
| 5,602,046 | 2/1997 | Calafut et al. | 437/41 |

(List continued on next page.)

OTHER PUBLICATIONS

Kraisorn Throngnumchai, "A Study on the Effect of the Gate Contact Geometry and Dimensions on ESD Failure Threshold Level of Power MOSFET's", IEEE Transactions on Electron Devices, vol. 41, No. 7, Jul. 1994, pp. 1282–1287.

Primary Examiner—Matthew Smith
Assistant Examiner—Igwe U. Anya
(74) Attorney, Agent, or Firm—Skjerven Morrill MacPherson LLP; David E. Steuber

(57) ABSTRACT

A MOSFET contains a voltage clamp including one or more diodes which connects its gate and source. The voltage clamp is designed to break down at a predetermined voltage and thereby protect the gate oxide layer from damage as a result of an excessive source-to-gate voltage. The voltage clamp generally contains one or more parallel branches connected between the source and gate terminals of the MOSFET. Each branch contains at least one diode and in many cases a series of diodes that, depending on the clamping voltage desired, are connected so that they either break down or conduct in a forward direction when the gate-to-source voltage reaches a selected level. To achieve a lower clamping voltage the diode or diodes are typically connected so that they conduct in a forward direction, and to achieve a higher clamping voltage the diode or diodes are connected so that they undergo avalanche breakdown. In many instances a given branch contains diodes that are connected in different directions (e.g., a diode pair connected anode-to-anode) in order to obtain a desired clamping voltage. If more than one branch is used, the diodes in one branch provide a clamping voltage that is less than the diodes in the other branch. A resistance can be connected in series with the diodes which provide the lower clamping voltage to limit the amount of current through those diodes and thereby prevent them from burning in the event that a current is forced through them.

9 Claims, 17 Drawing Sheets

U.S. PATENT DOCUMENTS

| | | | |
|---|---|---|---|
| 5,629,542 | 5/1997 | Sakamoto et al. | 257/328 |
| 5,631,187 | 5/1997 | Phipps et al. | 438/237 |
| 5,661,322 | 8/1997 | Williams et al. | 257/331 |
| 5,767,550 | 6/1998 | Calafut et al. | 257/355 |
| 5,777,367 | 7/1998 | Zambrano | 257/355 |
| 5,804,846 | 9/1998 | Fuller | 257/252 |
| 5,805,123 | 9/1998 | Satoh et al. | 345/60 |
| 5,811,857 | 9/1998 | Assaderaghi et al. | 257/355 |
| 5,818,084 | 10/1998 | Williams et al. | 257/329 |
| 5,909,139 | 6/1999 | Williams | 327/434 |
| 5,923,210 | 7/1999 | Le et al. | 327/538 |
| 5,946,588 | 8/1999 | Ahmad et al. | 438/585 |
| 5,998,836 | 12/1999 | Williams | 257/341 |

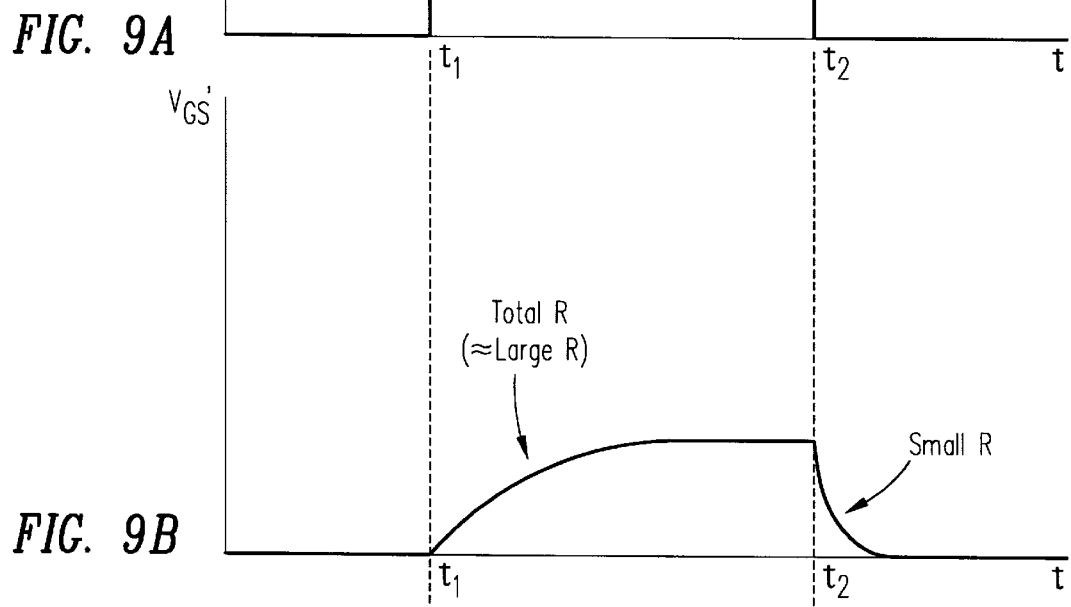
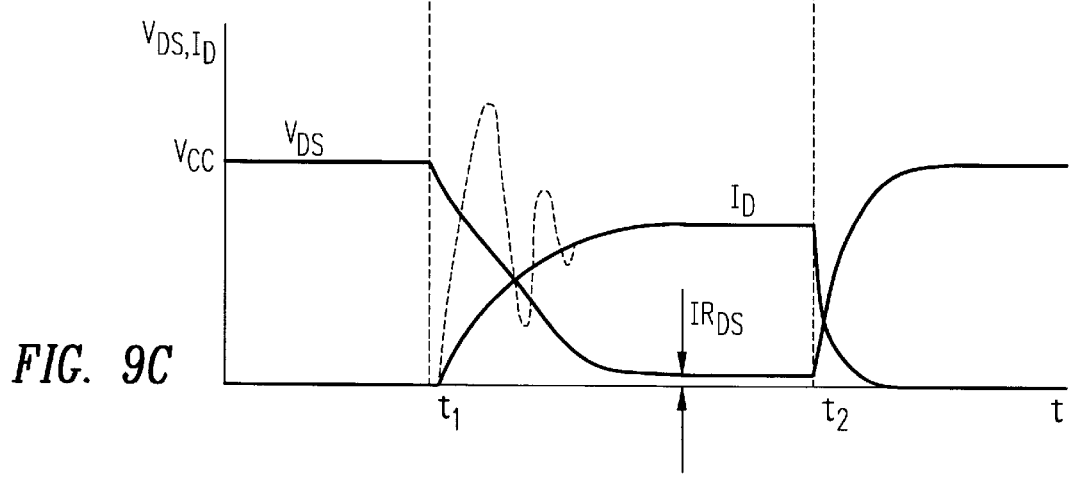
FIG. 9A
FIG. 9B
FIG. 9C

POWER MOSFET HAVING VOLTAGE-CLAMPED GATE

This application is a continuation-in-part of Application No. 09/001,768, filed Dec. 31, 1997, which is incorporated herein by reference in its entirety.

BACKGROUND

Power MOSFETs are generally used as switches to control the flow of power to an instrument such as a portable computer. FIG. 1A shows a schematic diagram of a power MOSFET 10 having a gate G', a source S' and a drain D' which is configured in a typical way with a buffer amplifier 12 connected to gate G'. MOSFET 10 also has a body B which is shorted to its source G' to prevent the parasitic bipolar transistor within MOSFET 10 from turning on. Also shown in FIG. 1A is a parasitic diode 11 with its anode connected to the source/body of MOSFET 10 and its cathode connected to the drain D'. Since MOSFET 10 is an N-channel MOSFET, buffer amplifier 12 supplies a positive gate drive voltage $V_{CC}$ to turn MOSFET 10 on or grounds gate G' to turn MOSFET 10 off. MOSFET 10 could also be a P-channel MOSFET in which case the voltage $V_{CC}$ necessary to turn MOSFET 10 on would be negative.

The source S', body B and drain D' are formed in a semiconductor material such as silicon. Gate G' is formed of a conductive material such as polycrystalline silicon and is separated from the semiconductor material by an insulating layer which is typically silicon dioxide. In normal operation, to protect the gate oxide layer, $V_{CC}$ is set not to exceed a maximum gate-to-source voltage $V_{GS}$(max). If $V_{CC}$ exceeds $V_{GS}$(max), the gate oxide layer may be ruptured or otherwise damaged, and MOSFET 10 may be permanently destroyed.

$V_{GS}$(max) is generally determined by the thickness ($X_{OX}$) of the gate oxide layer. As a rule, the gate oxide layer will rupture when $V_{GS}$ exceeds about 10 to 12 megavolts (MV) times the thickness $X_{OX}$ expressed in centimeters. When the oxide layer is thicker (e.g., 300 Å thick), this factor actually becomes lower (e.g., 8 MV/cm) because there is less leakage current as a result of tunneling between the gate and the semiconductor material. Tunneling does not damage the gate oxide layer. Thus, allowing a safety factor of 50%, $V_{GS}$ should normally be kept below 5 or 6 MV/cm multiplied by $X_{OX}$, or below 4 MV/cm multiplied by $X_{OX}$ when the gate oxide layer is thick. For example, a 175 Å thick oxide layer will rupture at 16 V to 18 V and $V_{GS}$(max) is around 8 V or 9 V, whereas a 300 Å thick oxide layer will rupture at about 24 V and $V_{GS}$(max) is about 12 V.

If the gate voltage $V_{GS}$ exceeds the higher rupture voltage, the device will be destroyed instantly. If $V_{GS}$ is in the range between the rupture voltage and $V_{GS}$(max), the device may not be destroyed instantly, but it may be partially damaged. Even if the gate voltage returns to a safe level below $V_{GS}$(max), this latent damage may eventually cause the gate oxide layer to wear out, and the device may later become inoperative. For this reason, MOSFETs which have been exposed to gate voltages in the interval between $V_{GS}$(max) and the rupture voltage are sometimes referred to as "walking wounded".

Voltages resulting from electrostatic discharges (ESD) present a different situation. Since ESD voltages are very high but often of very short duration, they are sometimes modeled as shown in FIG. 1B as a capacitor $C_{esd}$ charged to thousands of volts (e.g., more than 2 kV as shown in FIG. 1B) in series with resistor $R_{esd}$. Depending on the relative sizes of $C_{esd}$ and the gate capacitance of MOSFET 10 and the size of $R_{esd}$, MOSFET 10 may be able to survive the ESD pulse with no damage if $C_{esd}$ is small (i.e., the ESD pulse is short-lived) and $R_{esd}$ and the gate capacitance large. In this situation the flow of current into the gate is limited by $R_{esd}$, preventing the rate of rise of $V_{GS}$ to a dangerous level before the energy associated with the ESD pulse can be dissipated. In essence, the $C_{esd}$, $R_{esd}$ and the gate capacitance form a voltage divider circuit.

ESD pulses or other high voltages on the drain are not generally a problem because depletion spreading in the semiconductor material absorbs a significant part of the voltage between the drain and gate and thus the gate oxide layer is not exposed to the entire drain voltage.

FIG. 2 shows a graph of $V_{GS}$ applied to a MOSFET in several situations. The device could be designed for a normal gate drive of 5 V, and the rupture voltage could be 8 V. The overvoltage conditions of about 12 V oCCur when $V_{GS}$ exceeds 8 V in either a positive or negative direction. These conditions could arise from ringing voltages on a battery charger or when someone plugs in the wrong battery charger. Because these voltages are of a relatively long duration, they can burn up any diodes that are used to clamp the gate voltage. Finally, the device could be subjected to an ESD pulse of plus or minus 2000 V. ESD pulses have a very short duration, however, so the diode clamps may be able to survive them.

FIGS. 3A and 3B are circuit diagrams of a lithium ion battery pack 30 that includes voltage clamps 31 and 33 to protect the gates of MOSFETs 32 and 34, respectively. MOSFETs 32 and 34 switch the current from a lithium ion battery 35 and are connected in series in a drain-to-drain configuration. The gate voltages of the MOSFETs 32 and 34 are controlled by a control IC 36. Voltage clamps 31 and 33 are shown as consisting of a single pair of back-to-back diodes. FIG. 3A shows an ESD pulse of 12,000 V applied to the terminals of the battery pack 30. If the devices are on when the ESD pulse oCCurs, the 12,000 V pulse is distributed in some manner among the devices in battery pack 30, and some portion will appear between the gate and source terminals of MOSFETs 32 and 34.

If a DC overvoltage of 12 V is applied, however, as shown in FIG. 3B, the control IC 36 may be able to survive and pass the entire 12 V on to the gates of MOSFETs 32 and 34. Assuming, for example, that voltage clamps 31 and 33 are designed to break down at 8 V, which is the rated operating voltage of MOSFETs 32 and 34, then the diodes within voltage clamps 31 and 33 will most likely conduct too much current and will burn up.

The above-referenced Application No. 09/001,768 describes a number of diode configurations that can be used as voltage clamps to protect the gate oxide layer.

SUMMARY

In aCCordance with this invention, one or more diodes are connected between the source and gate of the MOSFET. In normal operating conditions, the diodes are non-conductive and represent an open circuit. When the gate-to-source voltage exceeds a predetermined level, however, the diodes break down (or allow current to flow in the forward direction) and thereby clamp the voltage at the gate to a desired maximum level.

Numerous embodiments in aCCordance with this invention are possible. For example, a plurality of pairs of opposed diodes (i.e., diodes connected anode-to-anode or cathode-to-cathode) may be connected in series between the gate and source to protect the gate oxide against both positive and negative voltage spikes. A resistance may be connected between the gate of the MOSFET cells and the gate terminal or pad of the power MOSFET to limit the current flow through the diode pairs in the event of a breakdown condition. Additional opposed diode pairs can be connected as a second voltage clamp between the gate and source pads to protect the first group of diode pairs.

Alternatively, a parallel diode network can be substituted for the opposed diode pairs that are connected between the gate and source, with each branch of the parallel network containing a number of diodes oriented in the same direction (i.e., anode-to-cathode) and the diodes in each branch oriented in a direction opposite to the diodes in the other branch. These embodiments are particularly useful with thin gate oxide layers, since $V_{GS}$ is clamped at a voltage equal to the sum of the forward voltage drops across the diodes, each forward voltage drop typically being in the range of 0.6 V to 0.8 V. This arrangement can be used in conjunction with a resistor and a plurality of opposed diode pairs connected between the source and gate pads, as described above. If the gate voltage normally goes in only one direction (positive or negative) with respect to the source voltage, one branch of the parallel network could have only one diode in it, so that the gate is clamped at a single forward diode drop in the nonoperational direction.

In another group of embodiments a network containing a resistor and diode connected in parallel is connected in series with the above-described currentlimiting resistance in the path between the gate pad or terminal and the gate of the MOSFET. For an N-channel MOSFET this diode is connected with its anode facing the gate of the MOSFET and its cathode facing the gate pad or terminal. This arrangement allows the MOSFET to be turned off more rapidly than it is turned on, since when the gate is driven low to turn the MOSFET off, the diode is forward-biased and conducts a current that in effect bypasses the resistor with which it is connected in parallel. For a P-channel MOSFET the diode is connected with its anode facing the gate pad or terminal and its cathode facing the gate of the MOSFET. Having a turn-on time that is relatively slow as compared to the MOSFET's turn-off time is advantageous in that a slow turn-on time avoids the ringing and overshoot conditions that can oCCur when there is an inductance in the circuit.

BRIEF DESCRIPTION OF THE DRAWINGS

The principles of this invention will be understood with reference to the following drawings, in which like components are identified by the same reference numbers.

FIG. 4F is a circuit diagram of an embodiment wherein the voltage clamp includes a plurality of diodes connected in parallel with a single diode.

FIGS. 8A–8D are circuit diagrams of embodiments similar to those shown in

FIGS. 4B, 4C and 4E wherein the voltage clamp contains a diode and a resistor connected in parallel between the gate pad or terminal and the gate of the MOSFET.

FIGS. 9A–9C are timing diagrams illustrating the differential turn-on, turn-off characteristics of the embodiments shown in FIGS. 8A–8D.

DESCRIPTION OF THE INVENTION

Figure 1A:
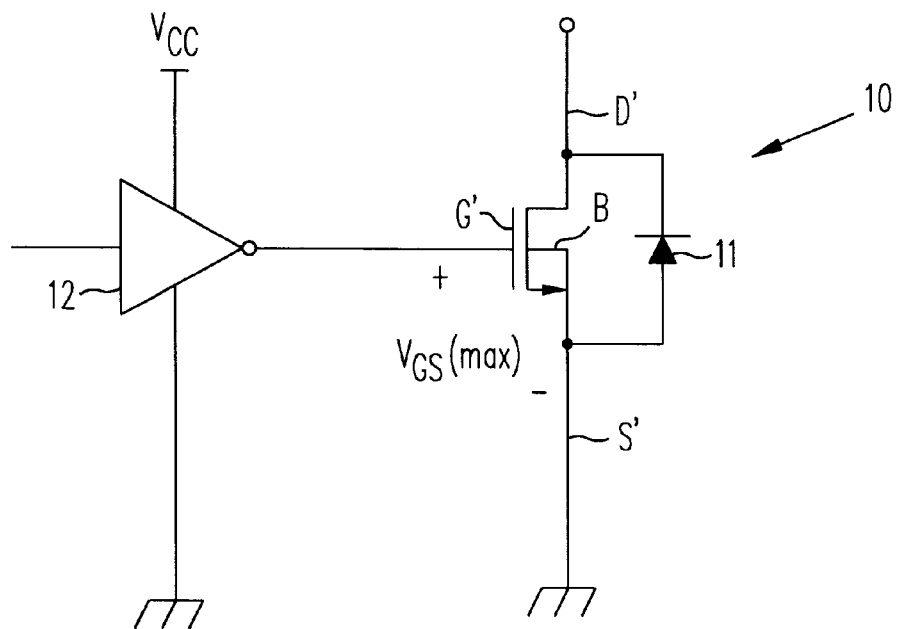
FIG. 1A is a schematic diagram of a conventional power MOSFET.
Figure 1B:
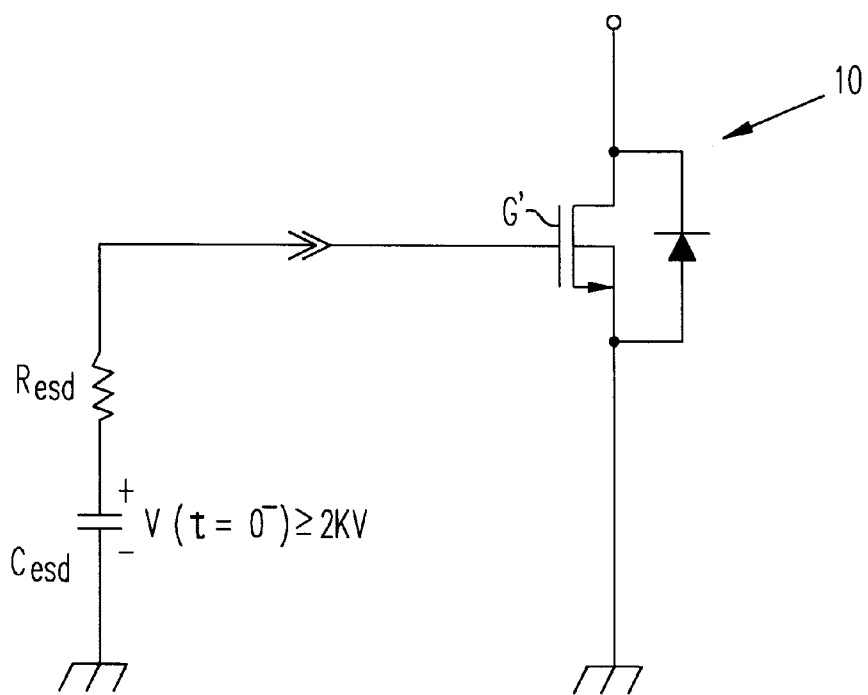
FIG. 1B is an equivalent circuit diagram illustrating the application of an electrostatic discharge pulse to the gate of the MOSFET.
Figure 2:
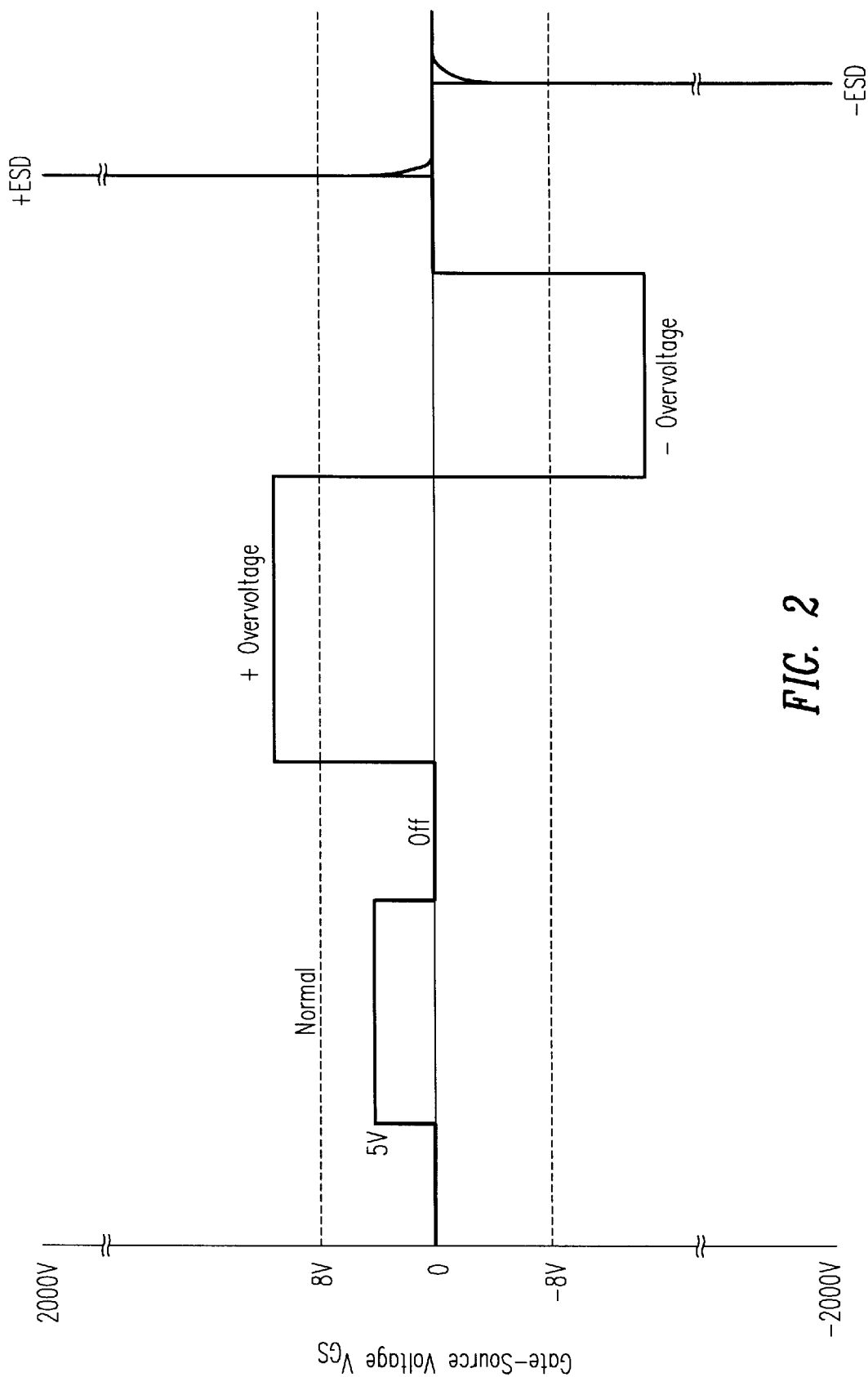
FIG. 2 is a graph illustrating the gate voltage of a MOSFET when in a normal operating condition, when subjected to an overvoltage condition, and when subjected to an electrostatic discharge.
Figure 3A:
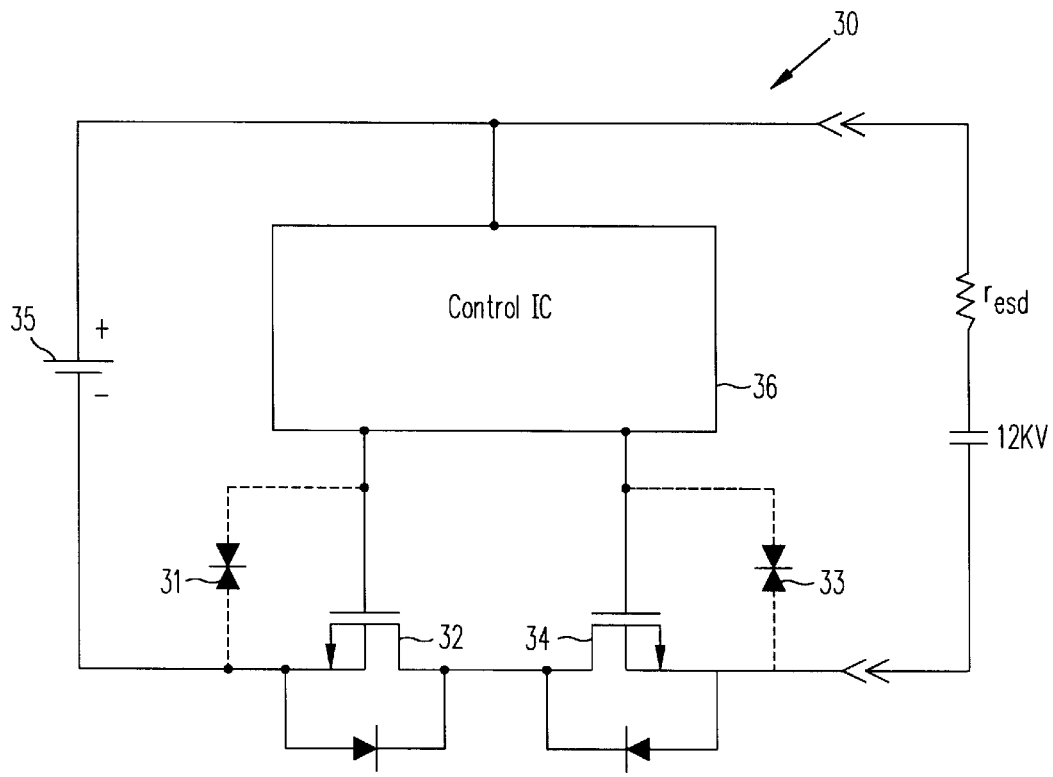
FIG. 3A is a circuit diagram of a battery pack containing a lithium ion battery and switch containing a pair of MOSFETs and voltage clamps to protect the gates of the MOSFETs, with the battery pack being subjected to an electrostatic discharge pulse.
Figure 3B:
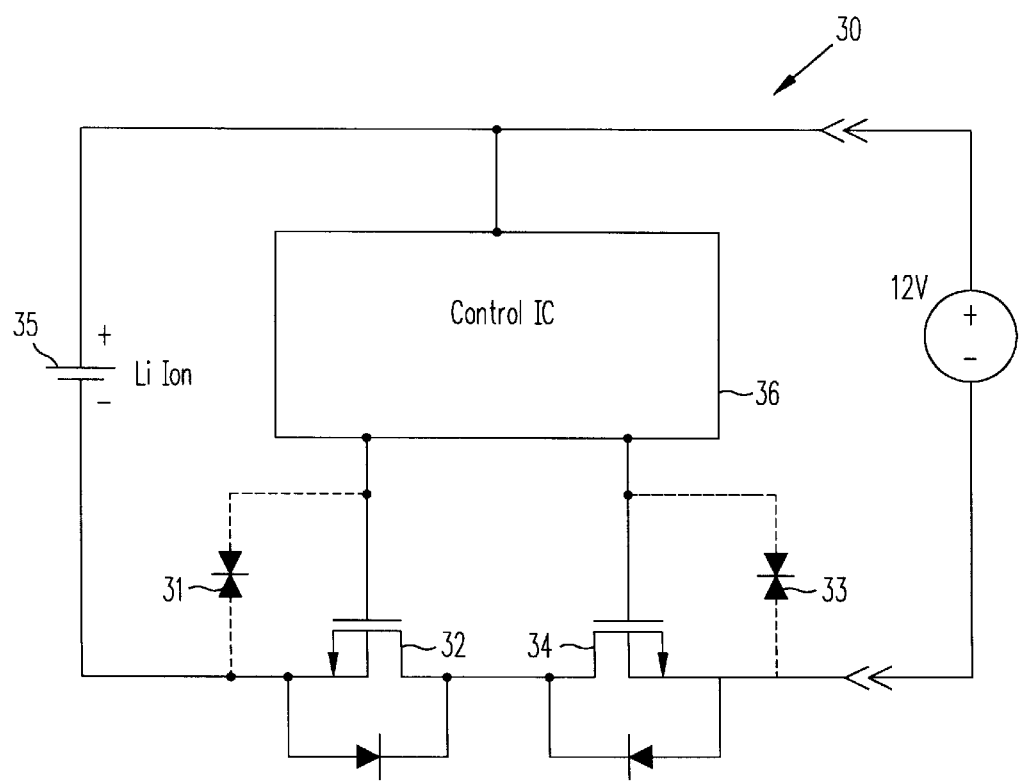
FIG. 3B is a circuit diagram similar to FIG. 3A with an improper battery charger being used to charge the lithium ion battery.
Figure 4A:
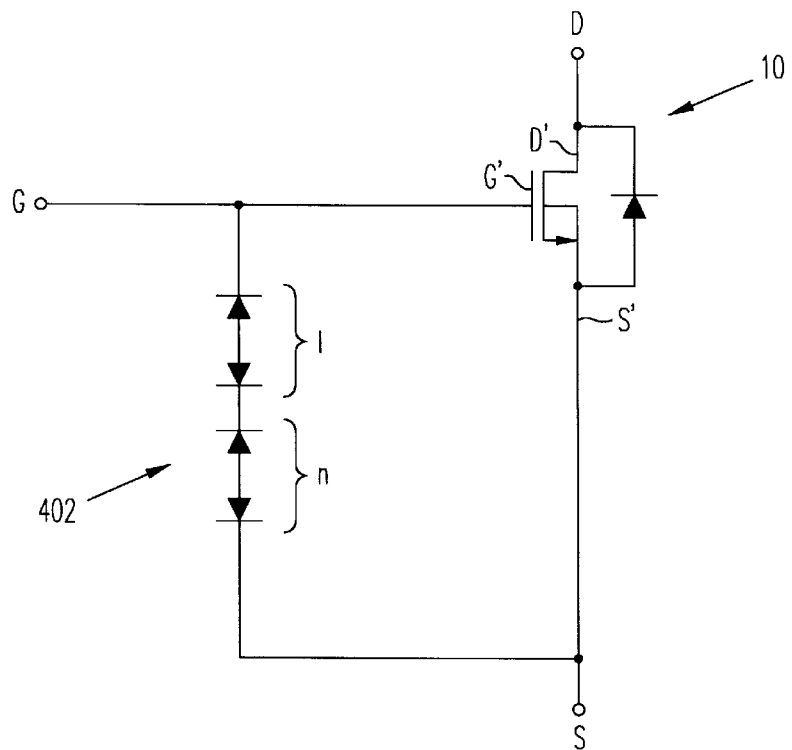
FIG. 4A is a circuit diagram of an embodiment aCCording to the invention wherein the voltage clamp includes a plurality of opposed diode pairs connected in series between the gate and source terminals of the MOSFET.

FIG. 4A is a circuit diagram of MOSFET 10 having a gate G' protected by a voltage clamp 402. The source, drain and gate terminals or pads of MOSFET 10, as distinguished from the internal regions of the device, are designated S, D and G, respectively. Voltage clamp 402 contains a series stack of n pairs of opposed diodes. i.e., the diode pairs are connected anode-to-anode, although they could also be connected cathode-to-cathode. The opposed diode pairs are connected between the gate G' and the source S' of MOSFET 10. Since the reverse breakdown voltage of each diode is typically in the range of 4.5 V to 7.7 V, and the forward voltage drop across a PN diode is in the range of 0.6 V to 0.7 V, each opposed diode pair will break down at a voltage of from about 5 V to 8 V, typically 6.5 V or 7.0 V. For example, assuming that voltage clamp 402 contains two diode pairs each having a breakdown voltage of 6.5 V, the gate G' would be clamped at about 13 V. The clamping voltage is varied by adjusting the breakdown characteristics of the individual diodes as well and the number of series-connected diode pairs.

Figure 5A:
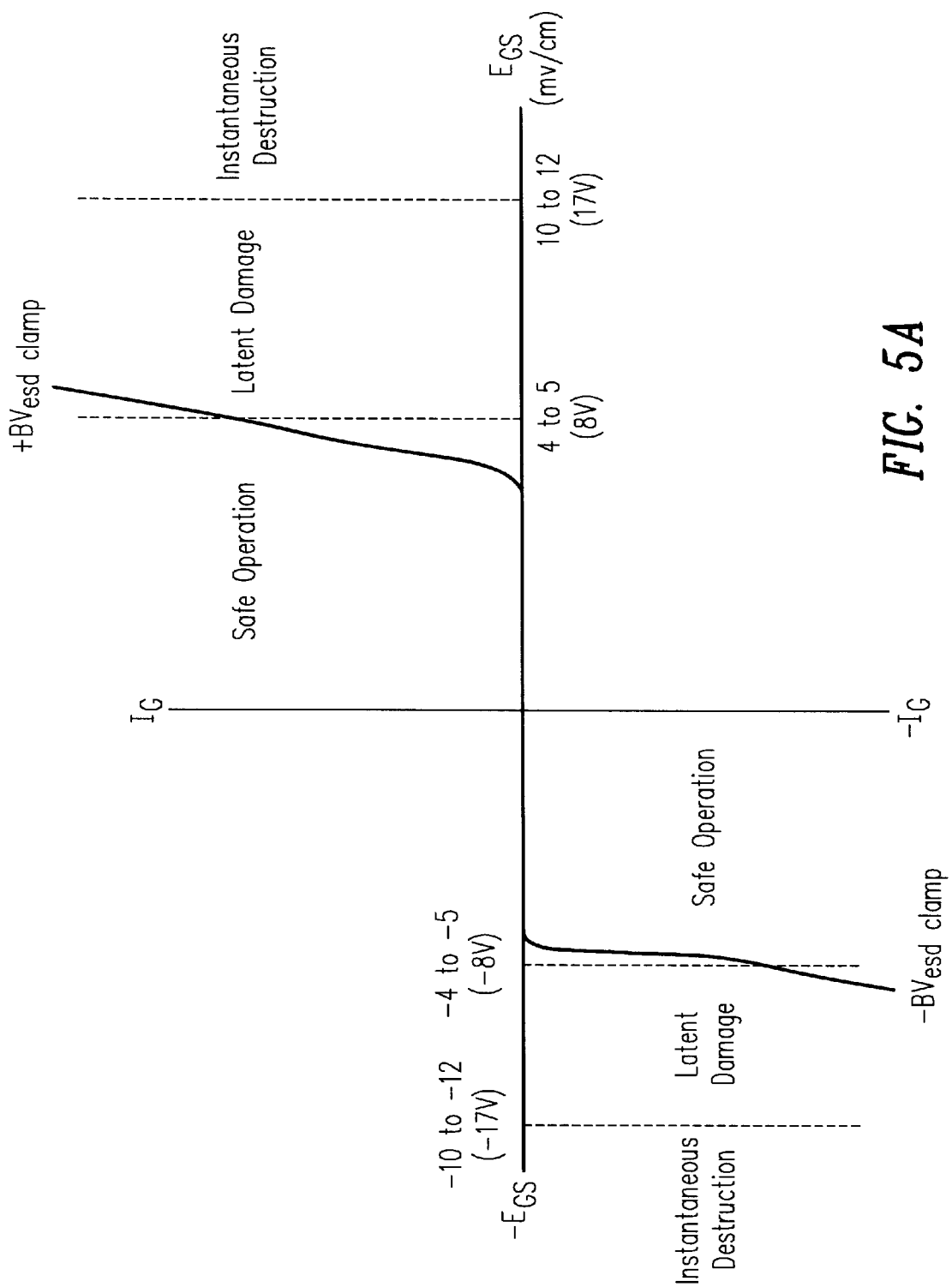
FIG. 5A is a current-voltage graph illustrating the operation of the embodiment of FIG. 4A.

The operation of voltage clamp 402 is illustrated in FIG. 5A, wherein the horizontal axis is the electric field $E_{GS}$ between the gate G and source S in MV/cm of gate oxide thickness and the vertical axis is the current $I_G$ through the voltage clamp. The vertical dashed lines indicate the dividing lines between the regions of safe operation, latent damage and instantaneous destruction, as described above. The numbers in parentheses indicate typical voltages for a 175 Å thick gate oxide layer. In this embodiment the diode pair in voltage clamp 402 is designed to break down at ±8 V, which is the voltage at which latent damage would begin to oCCur. The MOSFET would be destroyed if EGS reaches about ±17 V.

Once voltage clamp 402 breaks down, a current flows through the opposed diode pairs. If the current is large enough and lasts long enough, the diodes can burn up. Furthermore, the breakdown voltage should be set as close to the desired level (8 V in this case) as possible. If the breakdown voltage is much below the level the voltage clamp will provide better protection but the operating range of the gate voltage will have to be restricted; if the breakdown voltage is much above the desired level, the gate oxide layer may be subjected to latent damage. These problems are reduced with the voltage clamp 404 shown in FIG. 4B. Voltage clamp 404 includes an inner branch 406 which contains m opposed diode pairs connected in series between the gate G' and the source S', represented as a single diode pair, and an outer branch 406 which contains n opposed diode pairs connected between the gate pad G and the source pad S. A current-limiting resistance R is connected between the gate pad G and the gate G'.

Figure 5B:
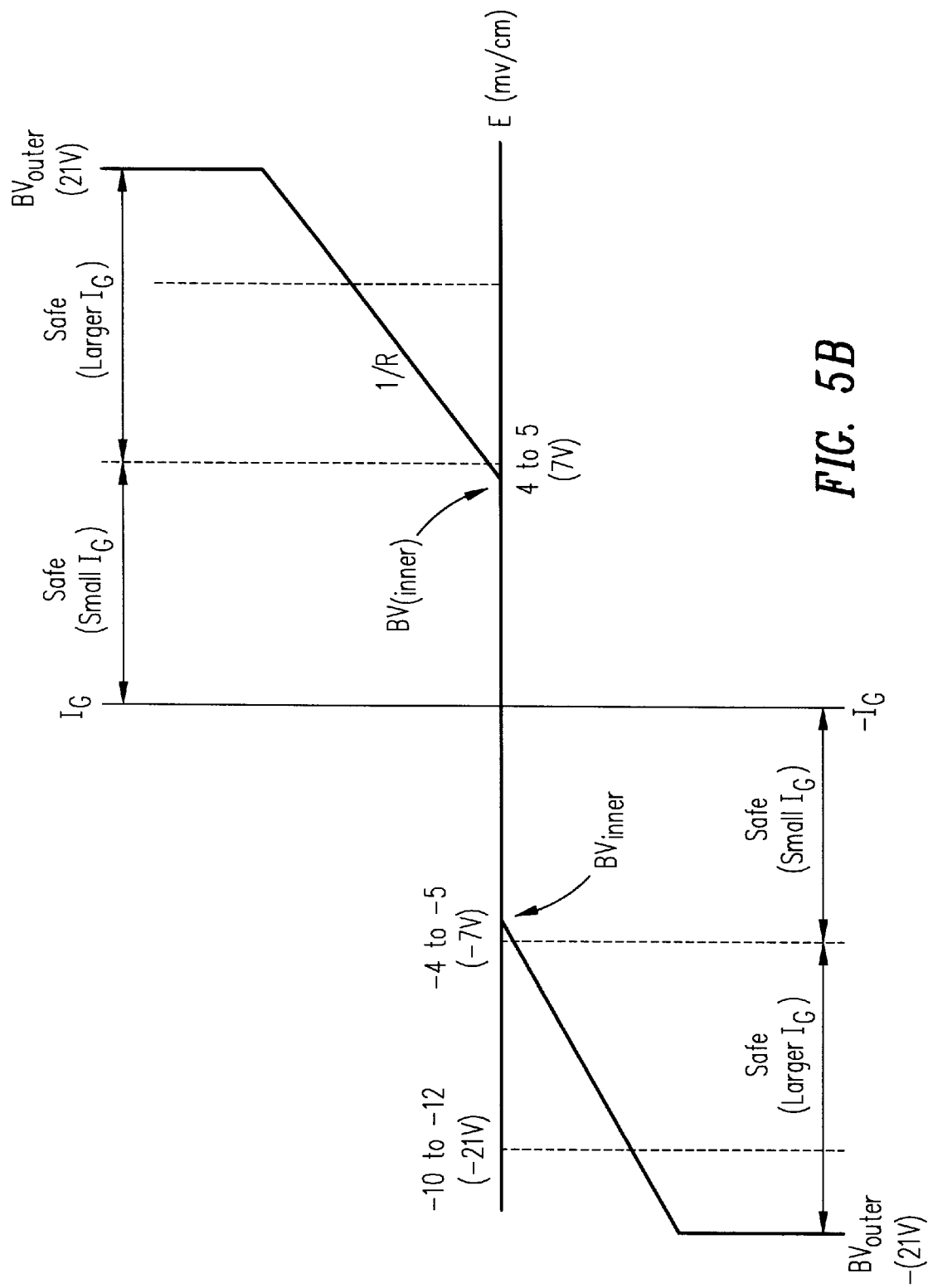
FIG. 5B is a current-voltage graph illustrating the operation of the embodiment of FIG. 4B.

The operation of voltage clamp 404 is shown in FIG. 5B. As with voltage clamp 402, the diode pairs in branch 406 break down at 4 to 5 MV/cm, which in this case is about 7 V. After this happens, however, the resistance R limits the current through the diode pairs and prevents them from burning up. The current increases at a rate of about 1/R while the gate voltage is still clamped at 7 V. The resistance R and the diode pairs essentially act as a voltage divider between the gate pad G and source pad S. This situation may continue into the region where instantaneous damage would normally oCCur. Only when the voltage between the gate and source pads exceeds the breakdown voltage of the diode pairs in the outer branch 408 does the current begin to increase dramatically. Even then, although the diodes in the outer branch 408 may burn up, the gate oxide is protected.

Figure 6A:
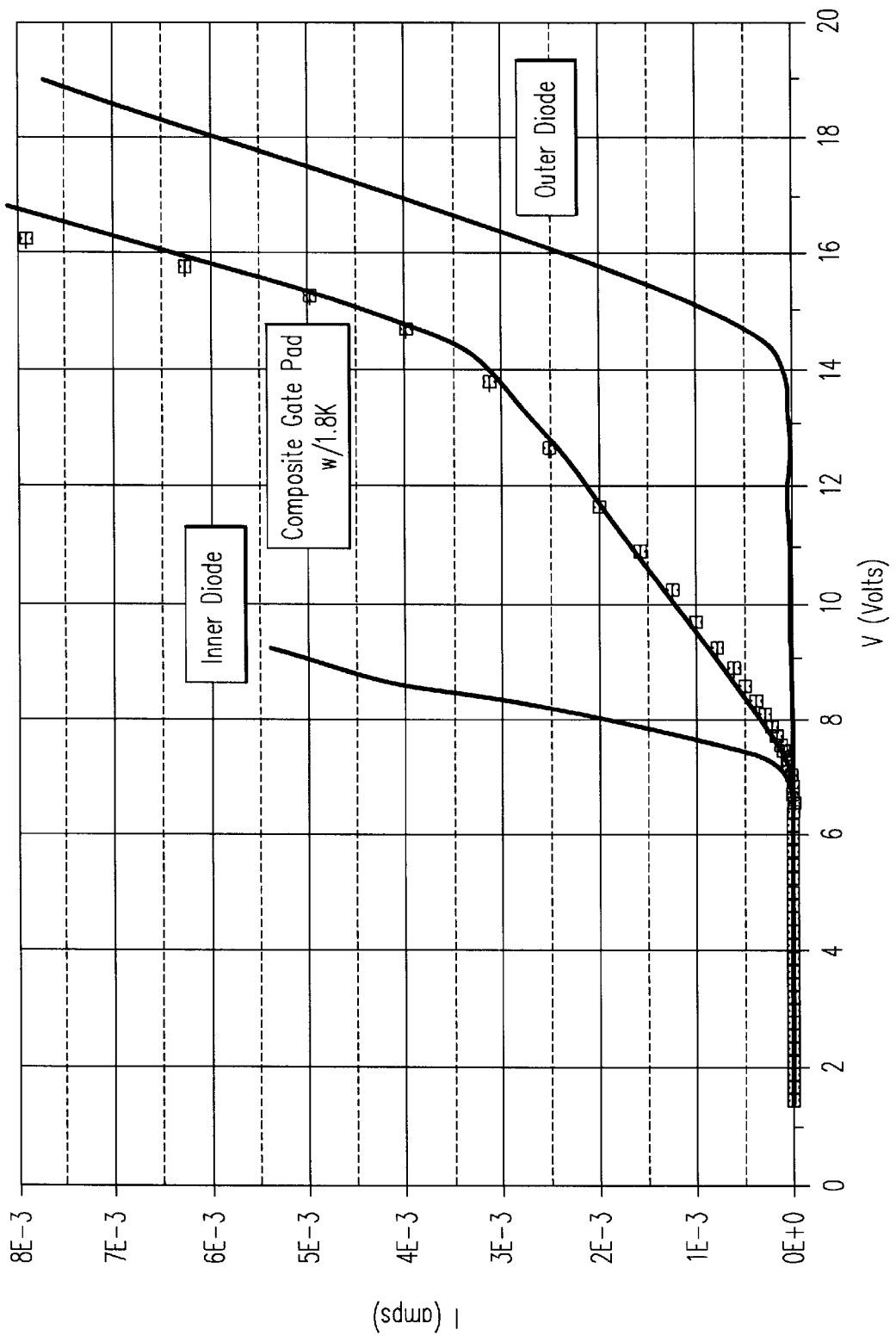
FIG. 6A is a current-voltage graph derived experimentally showing the operation of the embodiment of FIG. 4B.
Figure 6B:
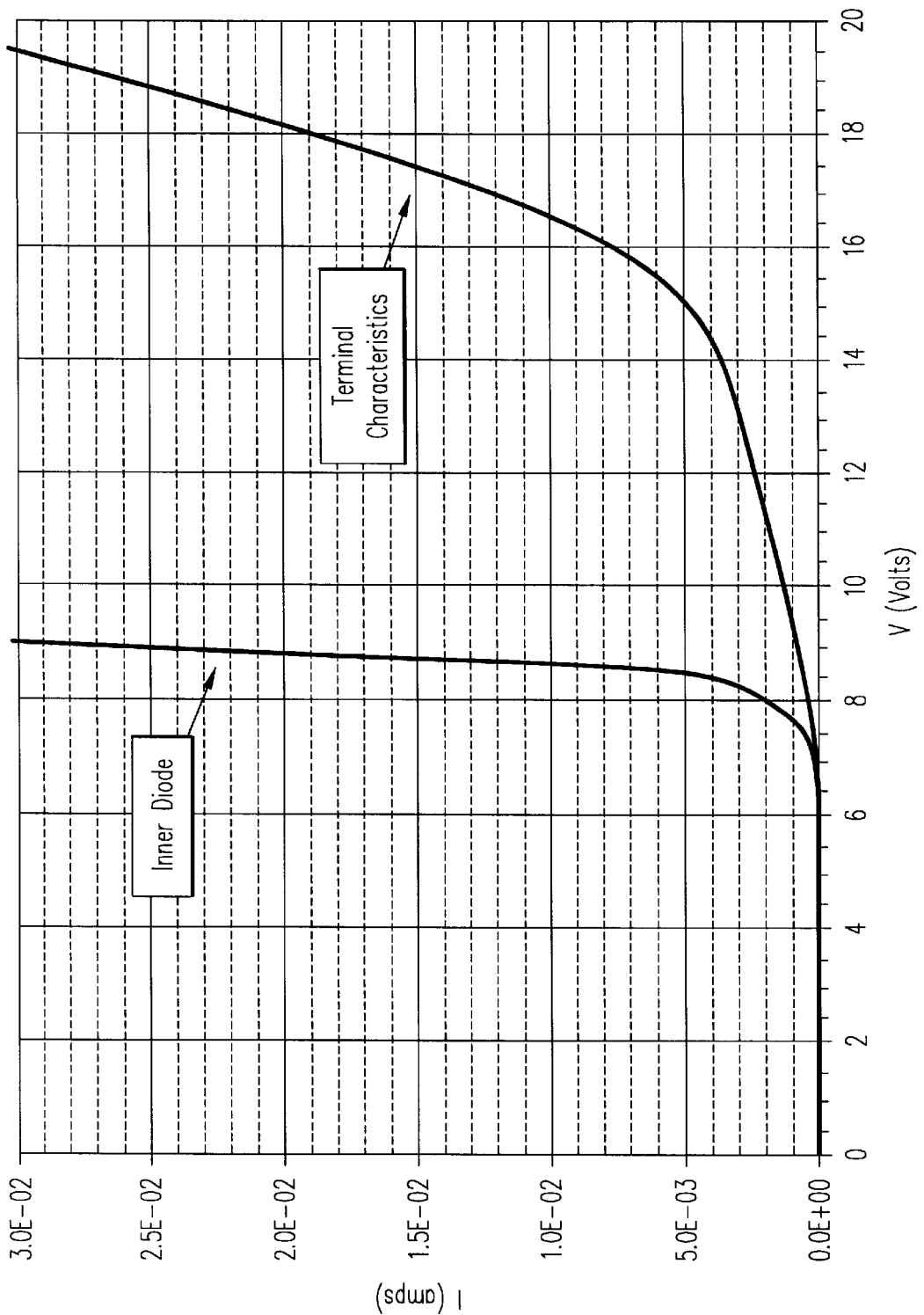
FIG. 6B shows the same data as is shown in FIG. 6A but at higher levels of current.

FIGS. 6A and 6B show measured data which corroborate FIG. 5B. The current-limiting resistance was set at 1.8 KΩ. As indicated, the inner diodes broke down at about 7 V, after which the current increased linearly until the outer diodes broke down at about 14 V. At that point the composite current between the gate and source pads began to increase more rapidly.

Using opposed diode pairs, it is difficult to get a breakdown voltage much below about 5 V, and this may be too high for very thin gate oxide layers. Voltage clamp 410, shown in FIG. 4C includes a parallel network of diodes, with the diodes in each of the two branches 412A and 412B directed in the same way but with the diodes in branch 412A directed opposite to the diodes in branch 412B. The clamping voltage is thus the sum of the forward voltage drops across the diodes in each branch. As shown in FIG. 5C, assuming that there are z diodes in each branch, with each diode having a forward breakdown voltage $V_f$, the gate is clamped at $z \cdot V_f$. If the forward drop across each diode is 1.2 V, for example, four diodes provide a total clamping voltage of about 5 V, which for a thin gate oxide layer could equate to 4 MV/cm. Because of the parallel arrangement the clamp operates in the same way whether the voltage between the gate and source is positive or negative (Quadrant I or Quadrant III operation).

Figure 4B:
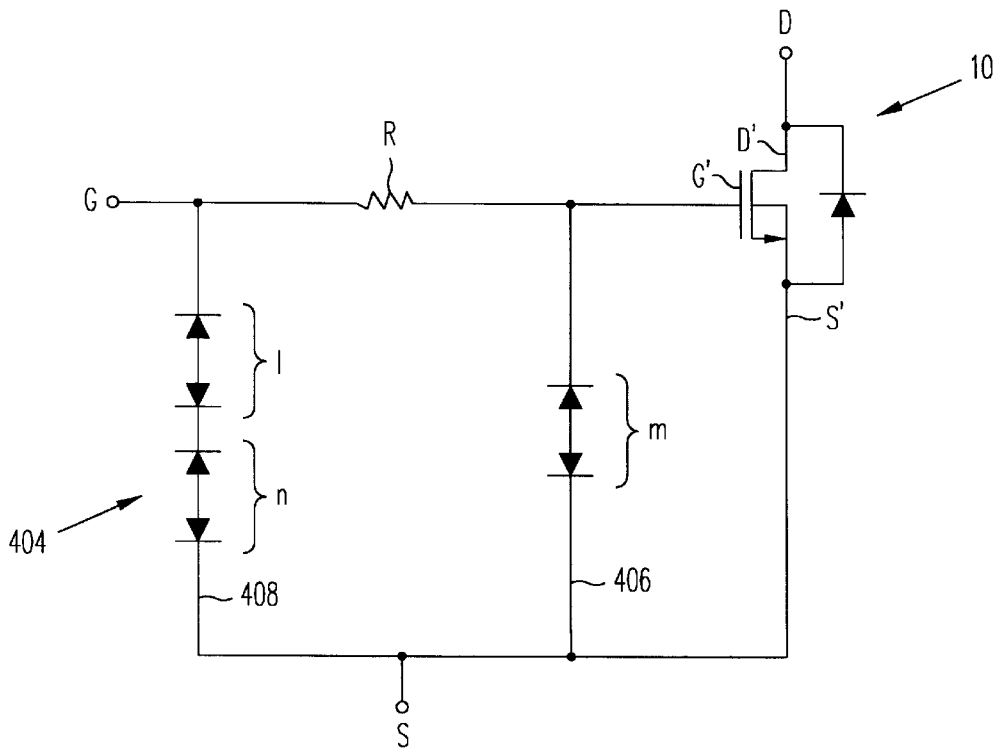
FIG. 4B is a circuit diagram of an embodiment which also includes a current-limiting resistor connected between the gate and the gate pad or terminal of the MOSFET and a second plurality of opposed diode pairs connected in series between the gate and source pads or terminals of the MOSFET.
Figure 4C:
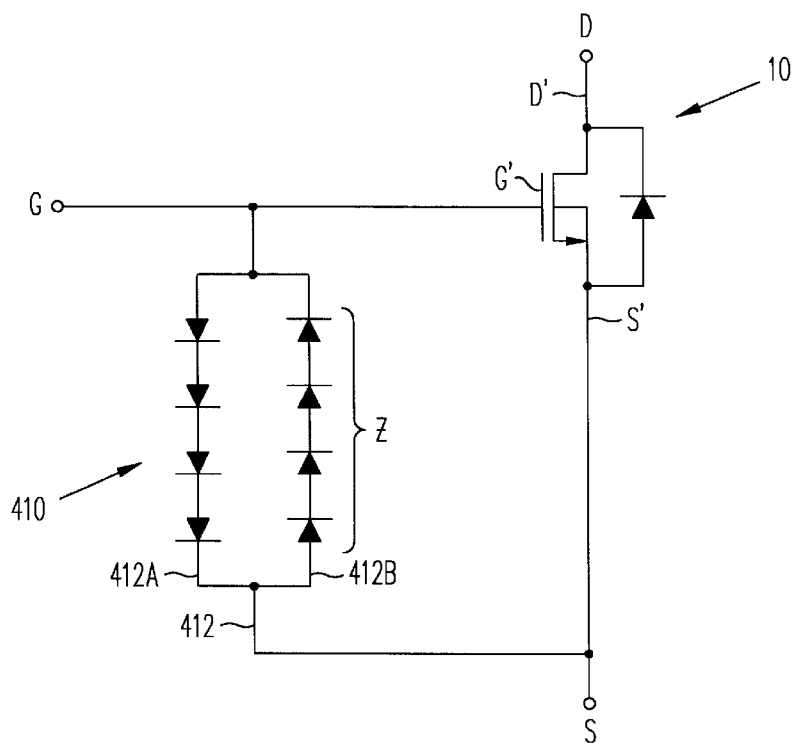
FIG. 4C is a circuit diagram of an embodiment wherein the voltage clamp includes a parallel network of diodes connected between the gate and source terminals of the MOSFET, the diodes in each branch of the between being oriented in the same direction but in a direction opposite to the diodes in the other branch.
Figure 4D:
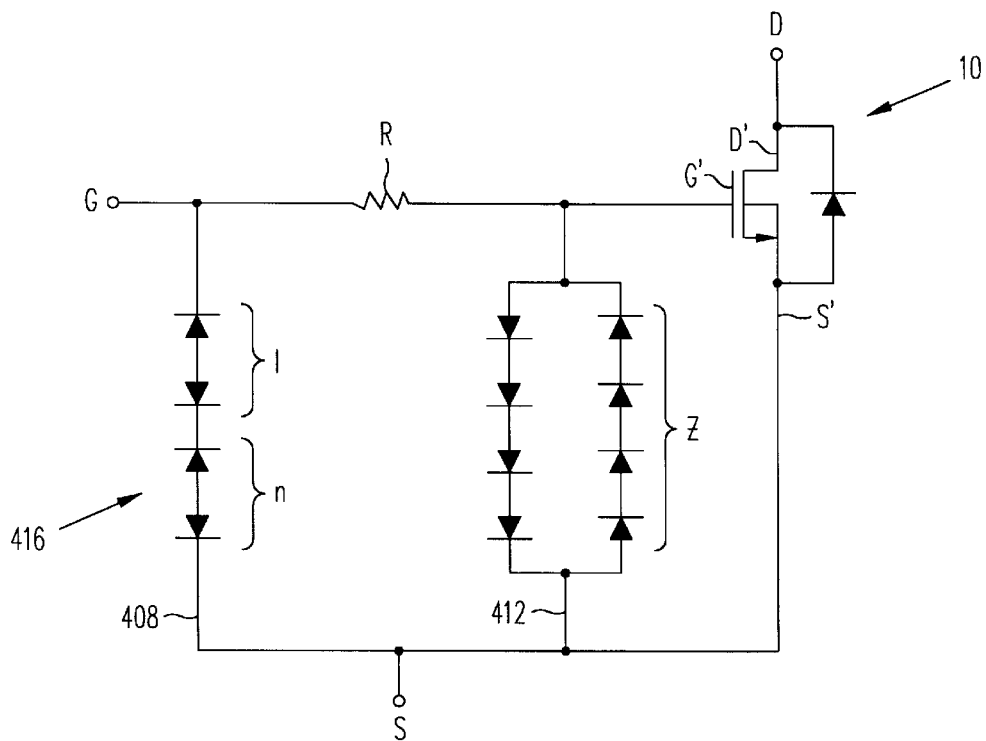
FIG. 4D is a circuit diagram of the clamp of FIG. 4C combined with a current-limiting resistance connected between the gate pad or terminal and the gate of the MOSFET and a plurality of opposed diode pairs connected between the gate pad or terminal and the source pad or terminal.
Figure 5C:
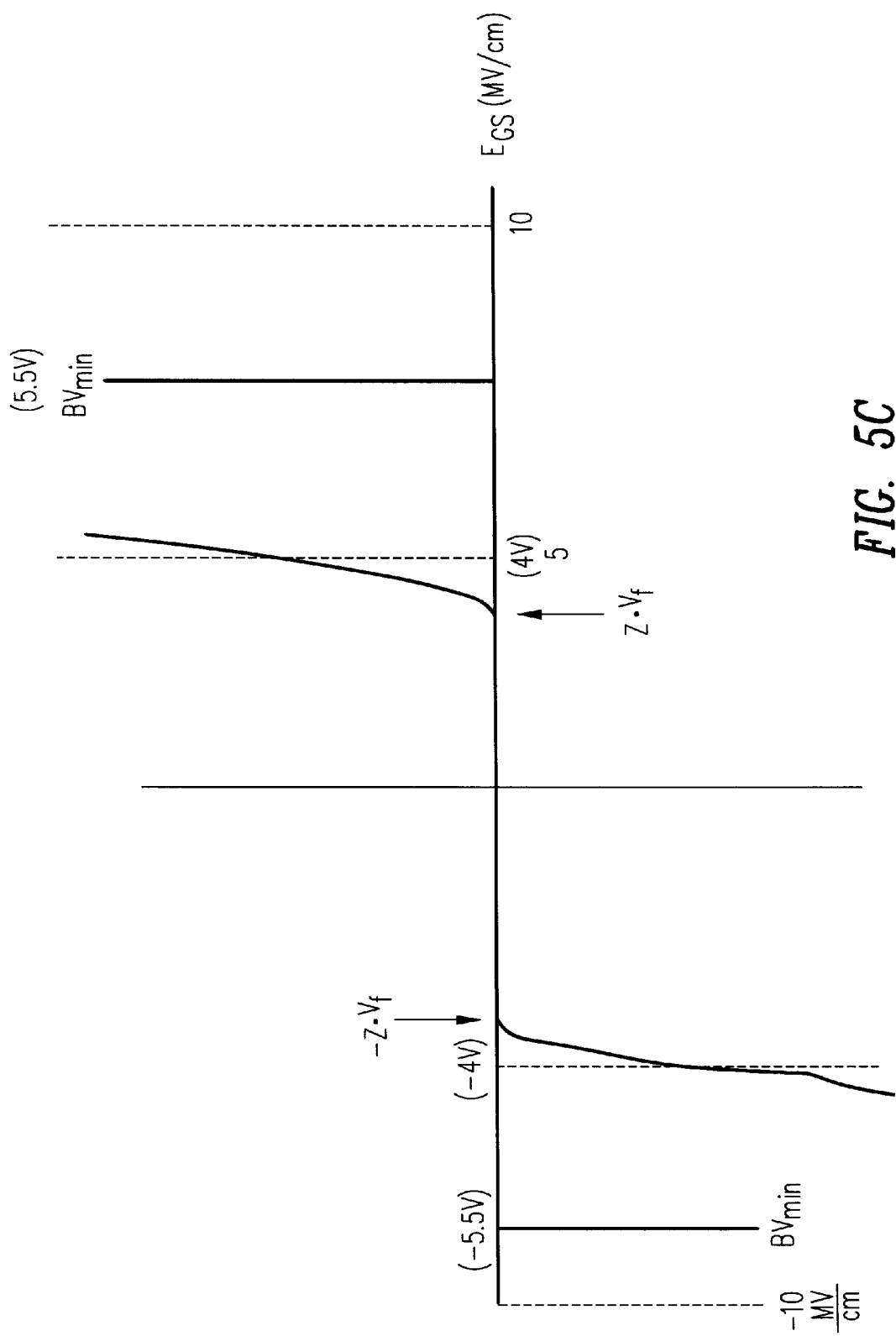
FIG. 5C is a current-voltage graph illustrating the operation of the embodiment of FIG. 4C.
Figure 5D:
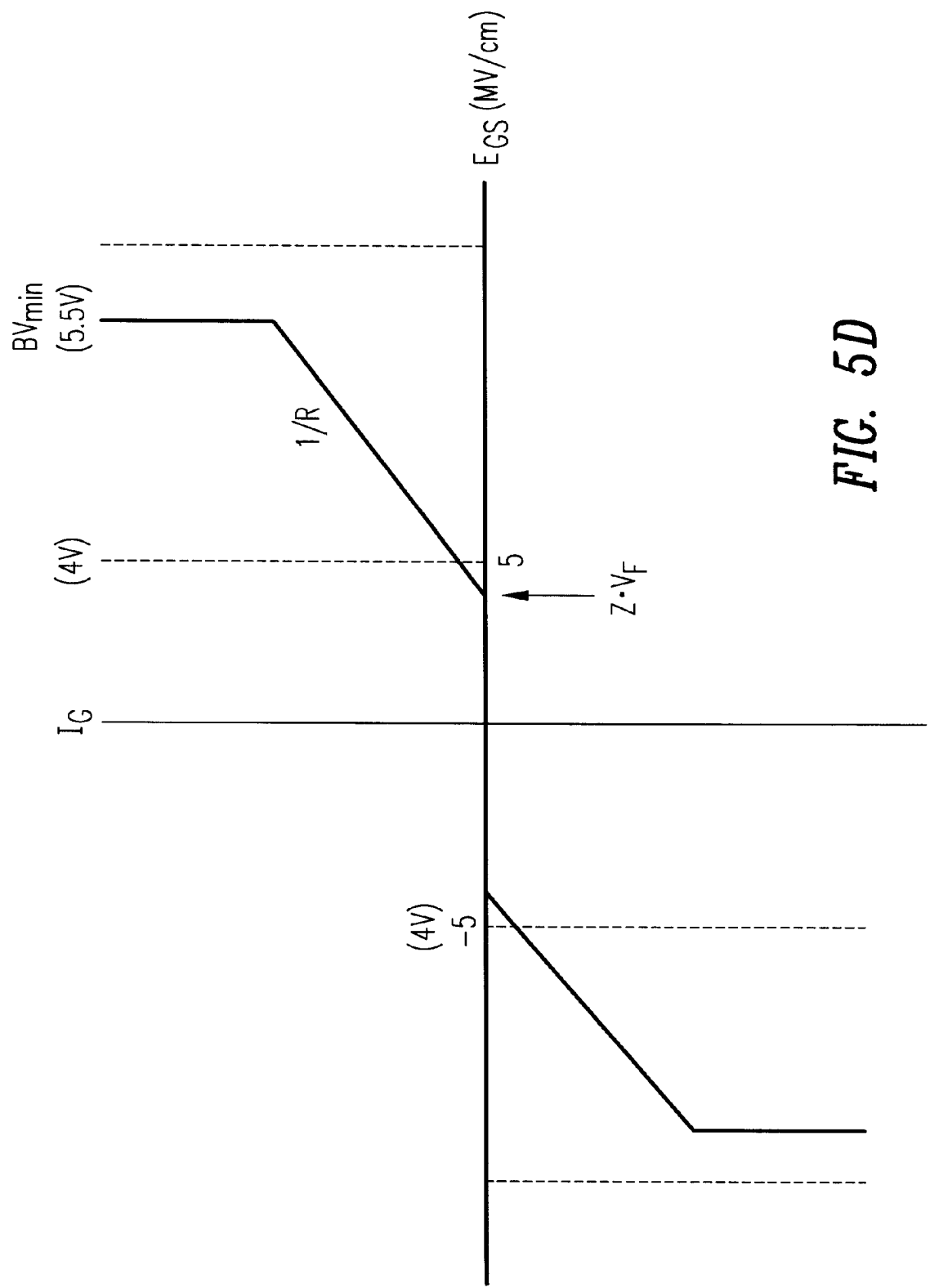
FIG. 5D is a current-voltage graph illustrating the operation of the embodiment of FIG. 4D.

Voltage clamp 416, shown in FIG. 4D, combines a parallel diode network of the kind shown in FIG. 4C with an outer branch 408, as shown in FIG. 4B. As shown in FIG. 5D, the current increases at a rate of 1/R after the parallel diode network breaks down at $z \cdot V_f$ until a voltage is reached at which the opposed diode pairs in the outer branch 416 break down. Assuming that there is a single pair of opposed diodes in the outer branch 416, the breakdown voltage of the outer branch could be as low as 5.5 V although with additional diode pairs it could be much higher.

Figure 4E:
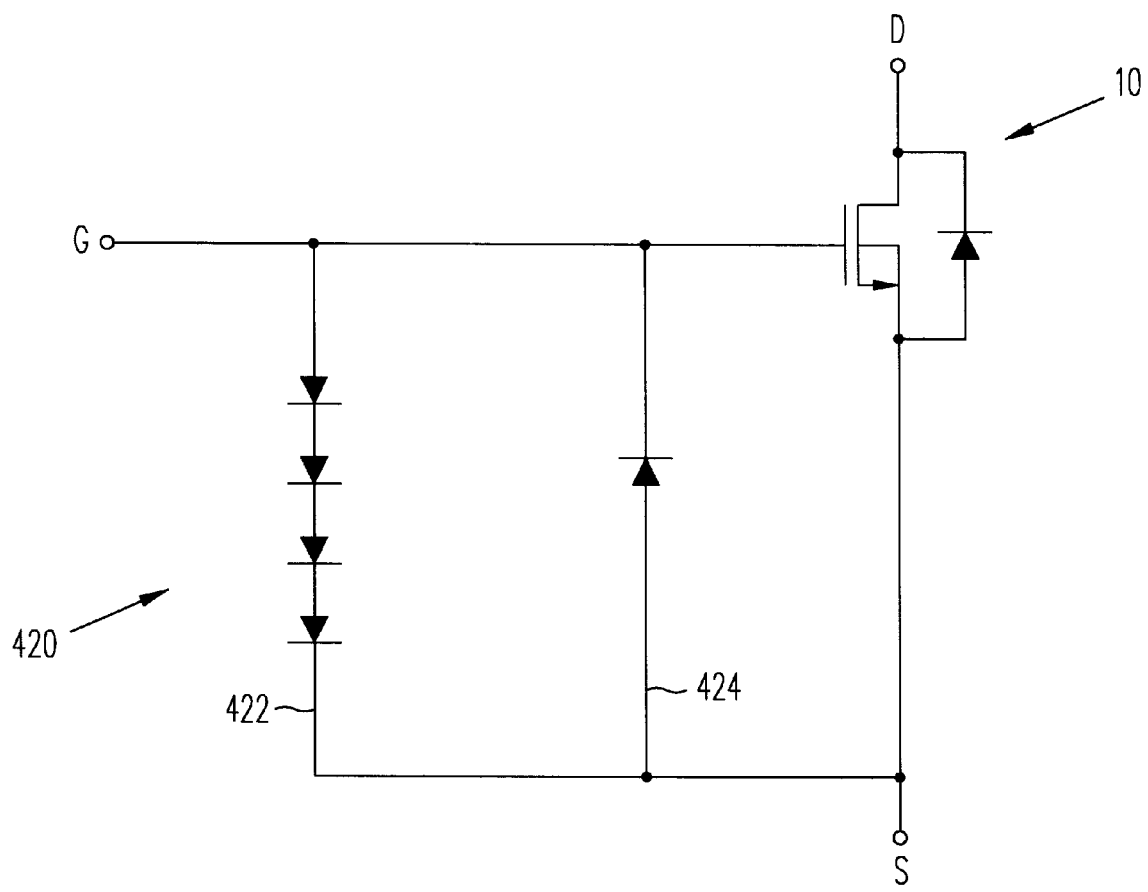

In some cases the operating gate voltage is always either positive or negative with respect to the source voltage. In that event a voltage clamp of the kind shown in FIG. 4E can be used. Voltage clamp 420 contains a parallel combination of four diodes oriented in one direction and a single diode oriented in the other direction. The single diode in branch 424 will clamp the gate when the gate voltage is only a single forward voltage drop below the source voltage. Thus voltage clamp 420 would be particularly useful where the gate voltage would never normally fall below the source voltage.

Thus, in a broad aspect, voltage clamps in aCCordance with this invention contain one or more parallel branches connected between the source and gate terminals of the MOSFET. Each branch contains at least one diode and in many cases a series of diodes that, depending on the clamping voltage desired, are connected so that they either break down or conduct in a forward direction when the gate-to-source voltage reaches a selected level. To achieve a lower clamping voltage the diode or diodes are typically connected so that they conduct in a forward direction, and to achieve a higher clamping voltage the diode or diodes are connected so that they undergo avalanche breakdown. In many instances a given branch contains diodes that are connected in different directions (e.g., a diode pair connected anode-to-anode) in order to obtain a desired clamping voltage. If more than one branch is used, the diodes in one branch provide a clamping voltage that is less than the diodes in the other branch. A resistance can be connected in series with the diodes which provide the lower clamping voltage to limit the amount of current through those diodes and thereby prevent them from burning in the event that a current is forced through them. Diodes in certain branches may protect the gate oxide layer from gate voltage swings in one direction while diodes in other branches may protect the gate oxide layer from voltage swings in the other direction.

In general, the diodes used in the voltage clamps described above should be as heavily doped as possible to provide the lowest possible resistance when they break down. However, when the doping in the diodes gets too high, they tend to become very leaky when they are reverse-biased, because they have a lot of defects. The leakage current is particularly high when the diodes are hot.

Figure 7A:
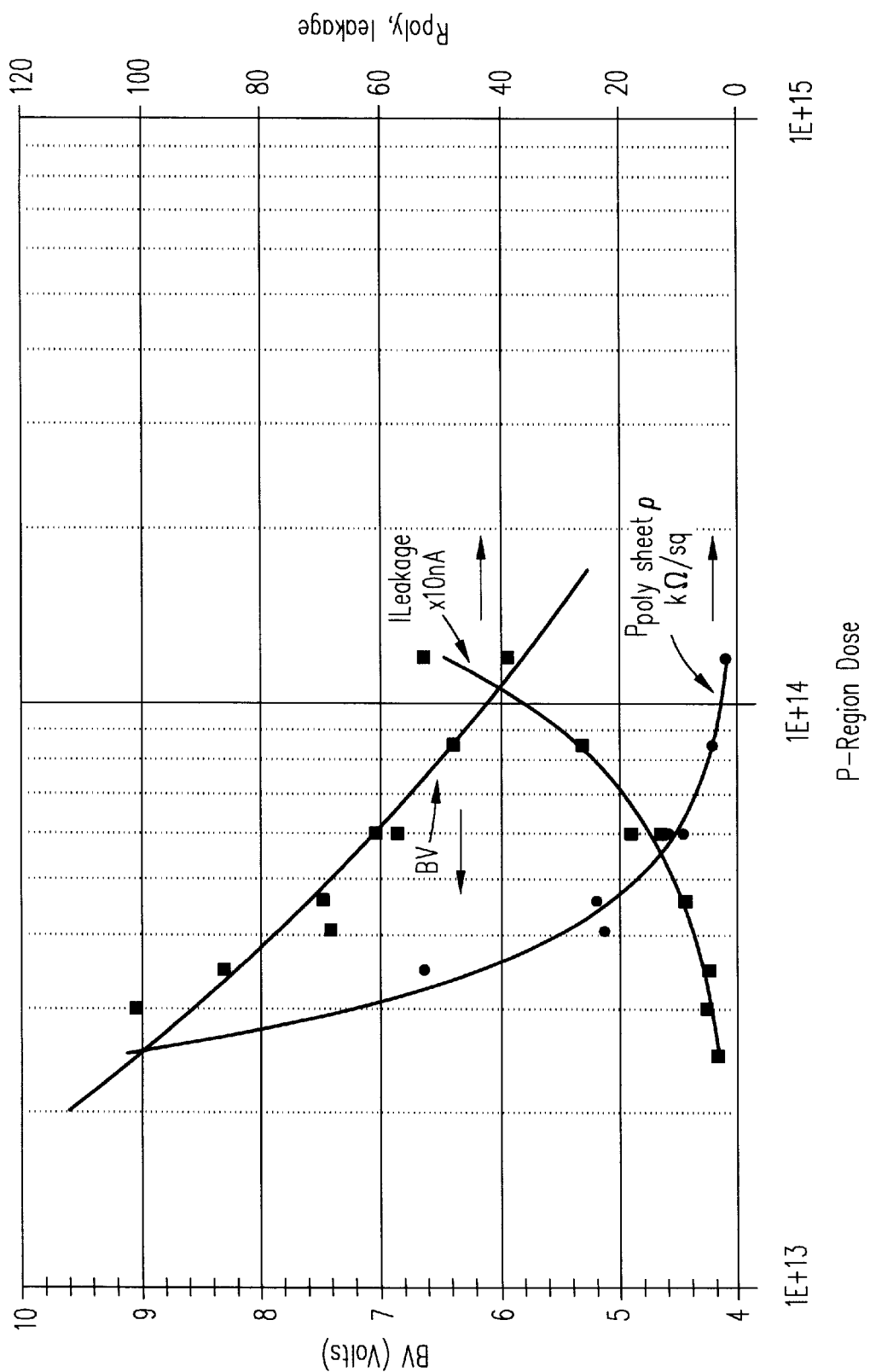
FIG. 7A is a graph showing the breakdown voltage, leakage current and resistance of a PN diode as a function of the dopant concentration in the P region.
Figure 7B:
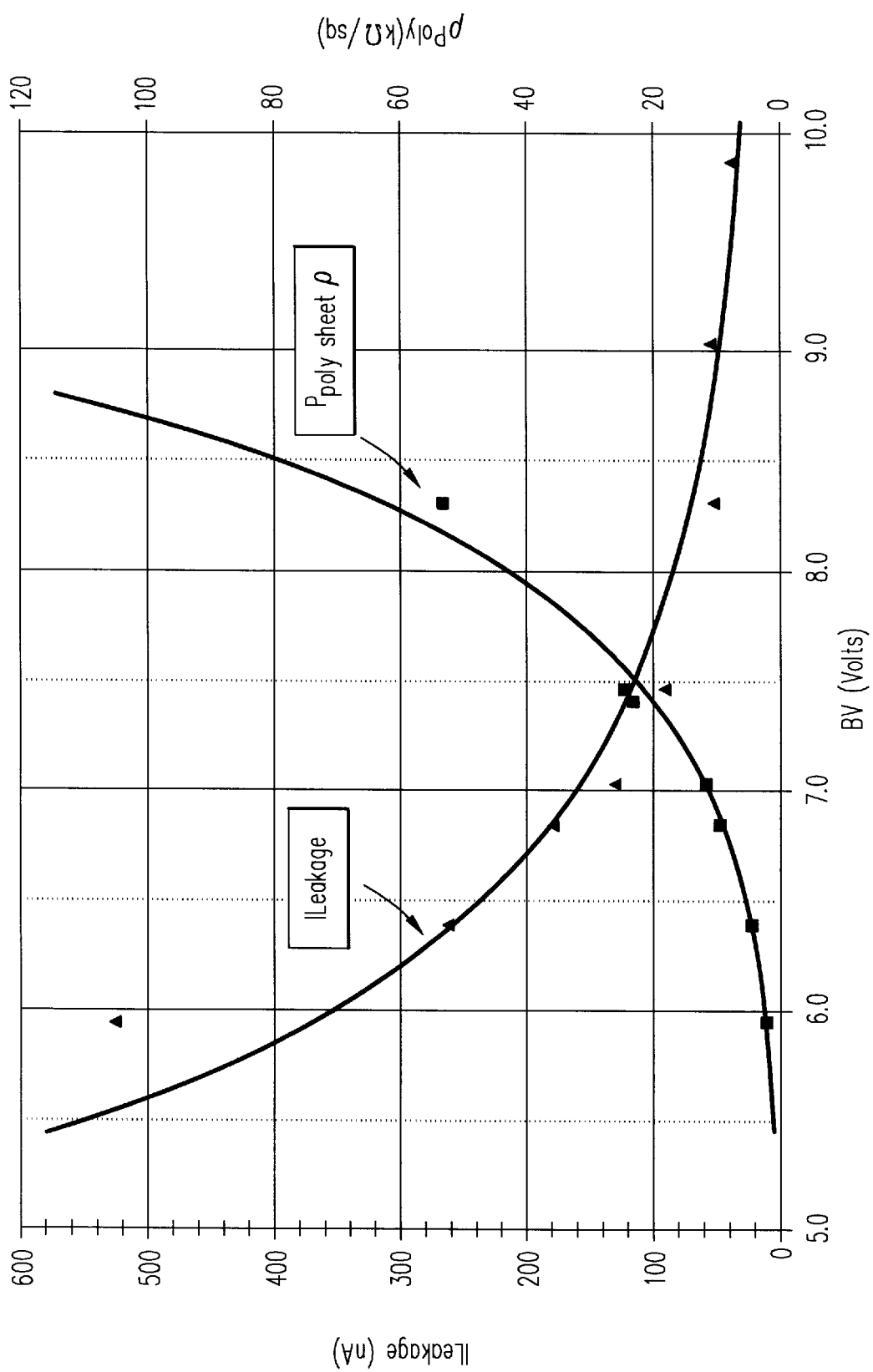
FIG. 7B is a graph showing the leakage current and resistance of a PN diode as a function of breakdown voltage.

FIGS. 7A and 7B are graphs which illustrate the relationships between these variables. In FIG. 7A, the horizontal axis is the doping concentration of the P region. The curve labeled BV represents the breakdown voltage of the diode, the scale being on the left axis. The curve labeled leakage shows the leakage current and the curve labeled Ppoly sheet p shows the sheet resistance, the scale for both variables being on the right margin. As expected, the breakdown voltage and sheet resistance decrease with increasing doping concentration, while the leakage current increases. The graph in FIG. 7B shows the leakage current (left axis) and sheet resistance (right axis) as a function of the breakdown voltage.

Voltage clamp 800 shown in FIG. 8 is similar to voltage clamp 404 (FIG. 4B), except that a large resistor $R_L$ and small resistor $R_S$ are connected in series between the gate pad G and the gate G', with a diode D1 being connected in parallel with resistor $R_L$ When the gate voltage is pulled high to turn on MOSFET 10 diode D1 is reverse-biased and the entire current in to the gate G' must flow through both resistor $R_L$ and resistor $R_S$. When, however, the gate voltage is pulled low again to turn off MOSFET 10, diode D1 is forward-biased and the current is shunted around the large resistor $R_L$. The resistance of $R_L$ can be in the range of 50 KΩ to 2MΩ; the resistance of $R_S$ could be in the range of 25Ω to 1 KΩ.

This operation is illustrated in FIGS. 9A, 9B and 9C, which show the voltage at the gate pad G (Vhd GS), the voltage at the gate G' ($V_{GS}'$), the source-to-drain voltage ($V_{DS}$) and the drain current ($I_D$) as a function of time. At time $t_1$, when the step function $V_{GS}$ is applied, $V_{GS}'$ rises at a rate which is determined essentially by the large resistor $R_L$. Correspondingly, $V_{DS}$ falls from $V_{CC}$ and $I_D$ rises from zero at rates which avoid any ringing or overshoot (illustrated by the dashed lines). In the steady state on condition, $V_{DS}$ is equal to I·$R_{DS}$. In contrast, at time $t_2$, when $V_{GS}$ is pulled low to turn MOSFET 10 off, $V_{GS}'$ falls at a rate determined by the small resistor $R_S$, and $V_{DS}$ and $I_D$ likewise vary at aCCelerated rates.

Figure 8A:
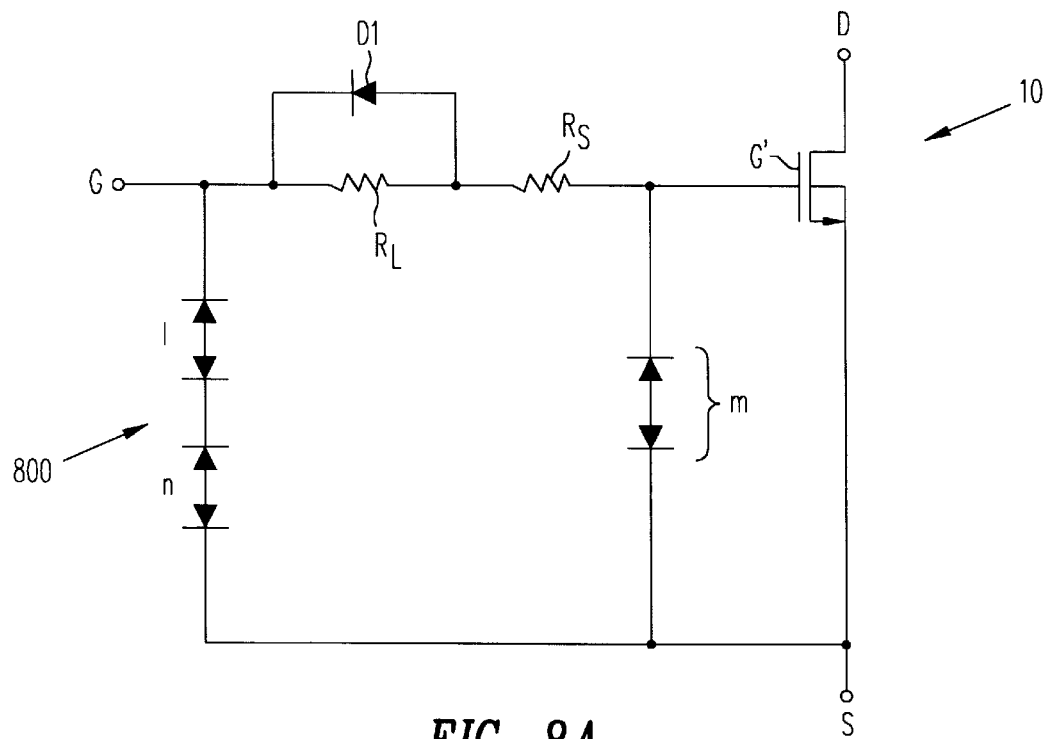
Figure 8B:
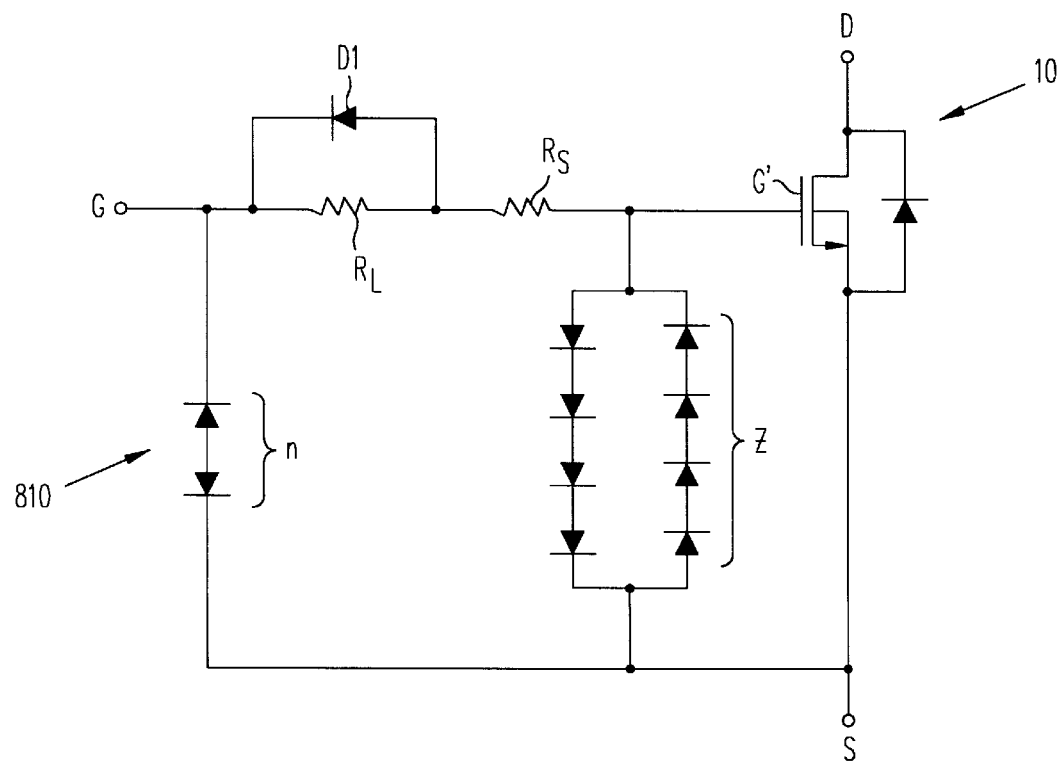
Figure 8C:
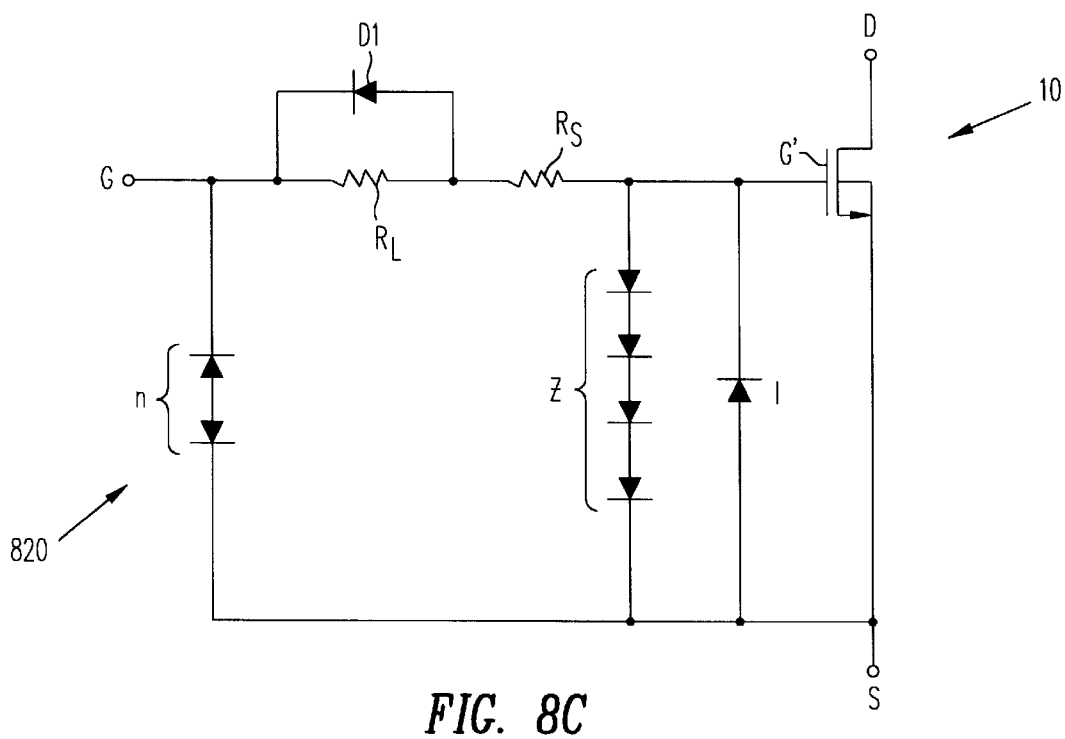
Figure 8D:
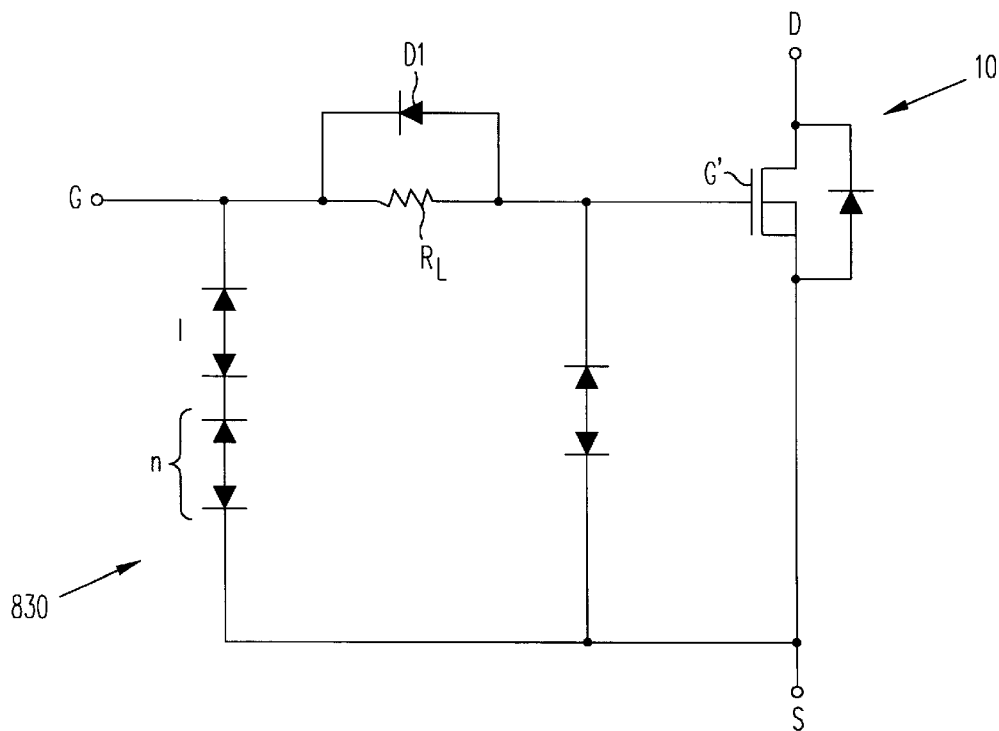

Voltage clamp 800 in FIG. 8A contains m opposed diode pairs in its inner branch and n opposed diode pairs in its outer branch, similar to voltage clamp 404 in FIG. 4B. Other alternative embodiments which provide a differential turn-on, turn-off condition are shown in FIGS. 8B–8D. Voltage clamp 810 shown in FIG. 8B contains a parallel diode network in its inner branch and n opposed diode pairs in its outer branch, similar to voltage clamp 416 shown in FIG. 4D; and voltage clamp 820 of FIG. 8C has an inner branch similar to voltage clamp 420 shown in FIG. 4E along with an outer branch containing n opposed diode pairs.

In voltage clamp 830 shown in FIG. 8D, the small resistor $R_S$ has been omitted and as a result the turn-off time is minimized. On the other hand, in a breakdown condition more current will flow through the clamping diodes.

The embodiments described above are illustrative only and should not be interpreted as limiting the broad scope of this invention. Many additional embodiments in aCCordance with this invention will be apparent to those skilled in the art.

I claim:

1. A MOSFET comprising a source, a drain and a gate, said source being separated from said gate by an insulating layer, said MOSFET further comprising a voltage clamp connected between said source and said gate, said voltage clamp limiting the difference between a first voltage at said source and a second voltage at said gate to a predetermined clamping voltage so as to prevent damage to said insulating layer, said voltage clamp comprising a parallel network having first and second branches, the first branch comprising a first plurality of diodes each of said diodes being directed in the same direction between said source and said gate.

2. The MOSFET of claim 1 wherein the second branch comprises a second plurality of diodes each of said diodes in said second plurality being directed in a direction between said source and said gate opposite to the direction of the diodes in said first plurality of diodes.

3. The MOSFET of claim 1 wherein said second branch comprises only a single diode said single diode being directed in a direction between said source and said gate opposite to the direction of the diodes in said first plurality of diodes.

4. A MOSFET comprising a source, a drain and a gate, said source being separated from said gate by an insulating layer, a gate terminal coupled to said gate and a source terminal coupled to said source, said MOSFET further comprising a voltage clamp connected between said source and said gate, said voltage clamp limiting the difference between a first voltage at said source and a second voltage at said gate to a predetermined clamping voltage so as to prevent damage to said insulating layer, said voltage clamp comprising at least one diode connected between said source and said gate and a parallel combination comprising a resistor and a second diode, said parallel combination being connected between said gate and said gate terminal.

5. The MOSFET of claim 4 wherein said source, said drain, said gate and said voltage clamp are formed in a single integrated circuit die.

6. The MOSFET of claim 4 wherein said diode comprises a junction between a region doped with P-type impurity and a region doped with N-type impurity.

7. The MOSFET of claim 4 further comprising a second resistor connected in a series path with said parallel combination between said gate terminal and said gate.

8. The MOSFET of claim 4 wherein said voltage clamp comprises first and second diodes connected in series anode-to-anode.

9. The MOSFET of claim 4 wherein said voltage clamp comprises first and second diodes connected in series anode-to-cathode.

* * * * *

UNITED STATES PATENT AND TRADEMARK OFFICE
CERTIFICATE OF CORRECTION

PATENT NO. : 6,172,383 B1
DATED : January 9, 2001
INVENTOR(S) : Williams

It is certified that error appears in the above-identified patent and that said Letters Patent is hereby corrected as shown below:

Title page,
Item [57], ABSTRACT, please delete everyting beginning with the words "If more than one branch is used…".

Column 2,
Lines 17 and 37, please delete "oCCur" and insert -- occur --;
Lines 55 and 63, please delete "aCCordance" and insert -- accordance --;

Column 3,
Line 28, please delete "currentlimiting" and insert -- current limiting --;
Line 42, please delete "oCCur" and insert -- occur --;
Line 66, please delete "aCCording" and insert -- according --;

Column 5,
Lines 18 and 48, please delete "oCCur" and insert -- occur --;

Column 6,
Line 34, please delete "aCCordance" and insert -- accordance --;

Column 8,
Line 1, please delete "aCCordance" and insert -- accordance --; and

Signed and Sealed this

Twenty-eighth Day of January, 2003

JAMES E. ROGAN
*Director of the United States Patent and Trademark Office*